US012607934B2

(12) United States Patent
Zhang et al.

(10) Patent No.: US 12,607,934 B2
(45) Date of Patent: Apr. 21, 2026

(54) PATTERNING MATERIAL AND PATTERNED FILM

(71) Applicant: HUAWEI TECHNOLOGIES CO., LTD., Shenzhen (CN)

(72) Inventors: Yu Zhang, Shenzhen (CN); Zhixiong Zeng, Shenzhen (CN); Huihui Zhou, Shenzhen (CN)

(73) Assignee: Huawei Technologies Co., LTD., Shenzhen (CN)

( * ) Notice: Subject to any disclaimer, the term of this patent is extended or adjusted under 35 U.S.C. 154(b) by 557 days.

(21) Appl. No.: 18/162,020

(22) Filed: Jan. 31, 2023

(65) Prior Publication Data

US 2023/0168583 A1 Jun. 1, 2023

Related U.S. Application Data

(63) Continuation of application No. PCT/CN2021/109938, filed on Jul. 31, 2021.

(30) Foreign Application Priority Data

Jul. 31, 2020 (CN) ......................... 202010761964.3

(51) Int. Cl.
*G03F 7/075* (2006.01)
*C08G 77/00* (2006.01)
*C08G 77/04* (2006.01)

(52) U.S. Cl.
CPC ......... *G03F 7/0757* (2013.01); *C08G 77/045* (2013.01); *C08G 77/80* (2013.01)

(58) Field of Classification Search
None
See application file for complete search history.

(56) References Cited

U.S. PATENT DOCUMENTS 7,737,228 B2 6/2010 Lichtenhan et al.
2004/0137241 A1 7/2004 Lin et al.
2004/0266148 A1* 12/2004 Yim ...................... B82Y 10/00 438/497

(Continued)

FOREIGN PATENT DOCUMENTS

CN 1577906 A 2/2005
CN 101688010 A 3/2010

(Continued)

OTHER PUBLICATIONS

International Search Report and Written Opinion in International Appln. No. PCT/CN2021/109938, mailed on Sep. 29, 2021, 19 pages (with English translation).

(Continued)

*Primary Examiner* — Jonathan Johnson
*Assistant Examiner* — Andrew Preston Traywick
(74) *Attorney, Agent, or Firm* — Fish & Richardson P.C.

(57) ABSTRACT

Example patterning materials and pattern films are described. One example patterning material includes polysiloxane. The polysiloxane includes at least one cyclic structure formed by silicon-oxygen (Si—O) bond repetitions and an organic group connected to a Si atom in the at least one cyclic structure. A subset of Si atoms in the at least one cyclic structure are substituted by a metal element, and/or at least one organic group includes a halogen element.

20 Claims, 2 Drawing Sheets

(56) References Cited

U.S. PATENT DOCUMENTS

| | | | | |
|---|---|---|---|---|
| 2005/0192364 | A1* | 9/2005 | Lichtenhan | C23C 18/1233 521/50 |
| 2008/0311514 | A1* | 12/2008 | Nakashima | C08G 77/045 430/323 |
| 2009/0085011 | A1 | 4/2009 | Lichtenhan et al. | |
| 2011/0195259 | A1 | 8/2011 | Song | |
| 2016/0046793 | A1 | 2/2016 | Phanopoulos et al. | |
| 2016/0264708 | A1* | 9/2016 | Klein | C08G 18/222 |
| 2020/0159120 | A1* | 5/2020 | Ogihara | G03F 7/36 |

FOREIGN PATENT DOCUMENTS

| | | | |
|---|---|---|---|
| CN | 101848914 | A | 9/2010 |
| CN | 101974120 | A | 2/2011 |
| CN | 103481608 | A | 1/2014 |
| CN | 105143313 | A | 12/2015 |
| CN | 105793327 | A | 7/2016 |
| CN | 106752627 | A | 5/2017 |
| CN | 108299645 | A | 7/2018 |
| CN | 109600996 | A | 4/2019 |
| EP | 3406752 | A1 | 11/2018 |
| JP | S55145355 | A | 11/1980 |
| JP | 2008081646 | A | 4/2008 |
| JP | 2011190413 | A | 9/2011 |
| KR | 101752182 | B1 | 6/2017 |
| WO | 2005022257 | A2 | 3/2005 |
| WO | 2019167770 | A1 | 9/2019 |
| WO | 2020030855 | A2 | 2/2020 |

OTHER PUBLICATIONS

Extended European Search Report in European Appln. No. 21850829.9, mailed on Dec. 12, 2023, 9 pages.

Office Action in Japanese Appln. No. 2023-506361, mailed on Mar. 19, 2024, 7 pages (with English translation).

* cited by examiner

PATTERNING MATERIAL AND PATTERNED FILM

CROSS-REFERENCE TO RELATED APPLICATIONS

This application is a continuation of International Application No. PCT/CN2021/109938, filed on Jul. 31, 2021, which claims priority to Chinese Patent Application No. 202010761964.3, filed on Jul. 31, 2020. The disclosures of the aforementioned applications are hereby incorporated by reference in their entireties.

TECHNICAL FIELD

This application relates to the field of integrated circuit manufacturing technologies, and in particular, to a patterning material and a patterned film formed by using the patterning material.

BACKGROUND

The popularity of high-performance electronic devices drives the constant development of industries related to integrated circuit manufacturing. With the continuous evolution of a manufacturing process of a chip in an integrated circuit, a chip integration level is increasingly high, key dimensions in the chip are increasingly small, the manufacturing process is increasingly precise, and requirements for performance of materials involved in the process are also increasingly high. In particular, a patterning material used in a patterning process directly affects the quality of a pattern (including pattern resolution, edge roughness, and the like), and finally affects the precision of the integrated circuit.

For an irradiation-based patterning technique, some of the existing commercial available patterning materials have low photosensitivity to 1 nm to 15 nm X-rays irradiation, resulting in low chip production efficiency; and some of the existing patterning materials have large modular sizes, leading to low resolution and high edge roughness of a pattern, and the quality of the formed pattern is insufficient to meet the requirements of the current patterning process. Therefore, to match the irradiation-based patterning technique, it is necessary to develop a patterning material with high sensitivity and high pattern resolution under a condition of 1 nm to 15 nm soft X-ray irradiation, to achieve a high efficiency and high quality patterning process.

SUMMARY

Embodiments of this application provide a patterning material that has high sensitivity and high pattern resolution under irradiation of 1 nm to 15 nm soft X-ray, and can implement an efficient and high-quality patterning process.

Specifically, a first aspect of embodiments of this application provides a patterning material, including polysiloxane, where the polysiloxane includes at least one cyclic structure formed by Si—O bond repetitions and an organic group connected to a Si atom in the cyclic structure, a part of Si atoms in the at least one cyclic structure are substituted by a metal element, and/or at least one organic group includes a halogen element. The patterning material adopts the polysiloxane with the cyclic structure as the main material, and the cyclic structure can well control the polysiloxane to have a small molecular size, so that the resolution of the pattern obtained by the patterning process can be improved and the edge roughness of the pattern can be reduced. The photosensitivity of the patterning material can be improved by introducing the metal element and/or the halogen element into the molecular structure of the polysiloxane. The patterning material in embodiments of this application is used to prepare an electronic component such as a chip, so that a high-quality pattern can be obtained, and precision and preparation efficiency of the component can be improved.

In some implementations of this application, the part of Si atoms in the at least one cyclic structure are substituted by the metal element. The metal element includes one or more of a transition metal element, a third main group metal element, a fourth main group metal element, a fifth main group metal element, or a sixth main group metal element. The metal element has abundant outer electrons, which may interact with soft X-ray photons and excite high-energy photoelectrons. The interaction between the high-energy photoelectrons and surrounding atoms, molecules, and chemical bonds promotes occurrence of a chemical reaction, that is, promotes a chemical change, leading to a change of final solubility of the patterning material. The metal element may be specifically, for example, one or more of Sn, Hf, Zr, Ti, or Sb.

In some other implementations of this application, the at least one organic group includes a halogen element. The halogen element may be F, Cl, Br, or I. The halogen element has high absorption efficiency for soft X-ray photons, so that the photosensitivity of the patterning material can be improved.

In some other implementations of this application, the part of Si atoms in the cyclic structure are substituted by the metal element. In addition, the at least one organic group includes a halogen element. The substitution by the metal element in the cyclic structure and the introduction of the halogen element into the organic group can effectively enhance the photosensitivity of the patterning material by double effects.

In this implementation of this application, the polysiloxane has a nanoscale size. Specifically, a molecular size of the polysiloxane is 0.2 nm to 5 nm. A small molecular size is beneficial to obtaining a high-quality pattern with high resolution and low edge roughness. Specifically, when the molecular size is small, during a chemical change, a size of a new structure formed by aggregation of a plurality of structural units is small, and a size of a new structure formed after a single structural unit is destroyed is smaller, thereby facilitating formation of a high-precision pattern and improving controllability of pattern edge roughness.

In this implementation of this application, the polysiloxane has one or more cyclic structures, that is, the polysiloxane may have a monocyclic structure or a polycyclic structure. The monocyclic structure means that there is only one cyclic structure formed by Si—O bond repetitions in the entire polysiloxane molecular structure. The polycyclic structure means that there are a plurality of cyclic structures formed by Si—O bond repetitions in the entire polysiloxane molecular structure. Connection manners of the plurality of rings may be different, and the polycyclic structure may be specifically a spiro structure, a condensed ring structure, a polyhedral structure (that is, a cage structure), or the like.

In this implementation of this application, a general formula of the polysiloxane may be represented as $Si_aO_bM_cR_d$, where M represents the metal element substituting the Si atoms in the cyclic structure, R represents the organic group connected to the Si atom, a and d are integers greater than or equal to 1, b is an integer greater than or equal to 2, c is an integer greater than or equal to 0, and $a+c\geq 2$. When d is greater than or equal to 2, a plurality of Rs may be same or different organic groups, and at least one organic group R includes a halogen element.

In some implementations of this application, a molecular main structure of the polysiloxane is shown in Formula (I):

Formula (I)

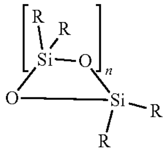

In Formula (I), R is the organic group, a plurality of Rs may be same or different organic groups, n is an integer greater than or equal to 1, the part of Si atoms in the cyclic structure are substituted by the metal element, and/or the at least one organic group R includes a halogen element.

In some other implementations of this application, a molecular main structure of the polysiloxane is shown in Formula (II):

Formula (II)

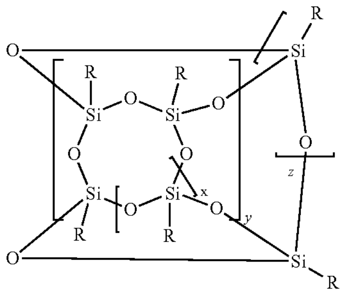

In Formula (II), R is the organic group, a plurality of Rs may be same or different organic groups, x is an integer greater than or equal to 0, y is an integer greater than or equal to 1, z is an integer greater than or equal to 0, the part of Si atoms in the at least one cyclic structure are substituted by the metal element, and/or the at least one organic group R includes a halogen element.

In some other implementations of this application, a molecular main structure of the polysiloxane is shown in Formula (III):

Formula (III)

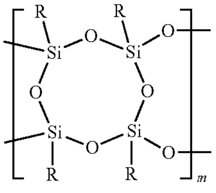

In Formula (III), R is the organic group, m is an integer greater than or equal to 1, the part of Si atoms in the at least one cyclic structure are substituted by the metal element, and/or the at least one organic group R includes a halogen element.

In this implementation of this application, a quantity of carbon atoms of the organic group is in a range of 1 to 20. A small quantity of carbon atoms can better control the molecular size of a siloxane compound.

In this implementation of this application, the organic group may be a substituted or unsubstituted hydrocarbyl, a substituted or unsubstituted oxyl, an organosilicon group, or an organic group including a metal atom. The organic group may include a hydroxyl, a cyano, a carbonyl, a carboxyl, an ether bond, an ester bond, a sulfonic ester bond, a carbonic acid, an ester bond, a lactonic ring, a sultone ring, a carboxylic acid anhydride, or the like. When the polysiloxane includes a plurality of organic groups, the plurality of organic groups may be same or different organic groups.

In this implementation of this application, the organic group includes an end group having reactive activity. The end group has the reactive activity, so that a capability of the polysiloxane to perform chemical reaction with surrounding adjacent molecules during and after exposure can be enhanced. In some implementations of this application, the end group may be a hydroxyl, a carboxyl, an aldehyde group, an amino, a saturated hydrocarbyl, an unsaturated hydrocarbyl, an azido, a sulfhydryl, or an epoxy group.

In this implementation of this application, an element composition of the organic group may be $C_eH_fX_gO_hN_iP_jS_o$-$Si_pM'_q$, where X is a halogen atom, M' represents a second metal element, e is an integer greater than or equal to 1, f, g, h, i, j, o, p, and q are integers greater than or equal to 0, and $(f+g+h+i+j+o+p+q) \geq e$. e may be an integer in a range of 1 to 20.

In this implementation of this application, in the organic group, an atom directly connected to the Si atom is a halogen atom, an O atom, a C atom, a N atom, a P atom, a S atom, or a Si atom. A stable chemical bond is formed between these atoms and the Si atom in the cyclic structure, so that the organic group is stably bonded to the cyclic structure.

In this implementation of this application, the patterning material further includes a solvent, and the solvent may be one of organic solvents such as an aliphatic hydrocarbon organic solvent, an aromatic hydrocarbon organic solvent, a halogenated hydrocarbon organic solvent, an alcohol organic solvent, an ether organic solvent, an ester organic solvent, a ketone organic solvent, a diol derivative, acetonitrile, and pyridine, or may be a mixture of a plurality of the foregoing organic solvents. The solvent can dissolve the polysiloxane to form a coating material. The polysiloxane in this embodiment of this application has good solubility, can be dissolved in most organic solvents, and has good coating performance as a patterning material. A surface of a film layer of the formed patterning material is smooth, a thickness of the film is easy for adjustment, and a development condition meets a requirement of a patterning process, to facilitate application.

In this implementation of this application, excluding the solvent, a mass of the polysiloxane in the patterning material accounts for greater than 50%. Large polysiloxane content can effectively ensure high efficiency and high quality of the patterning process.

In this implementation of this application, the patterning material may further include another component as required, and the another component may include one or more of a stabilizer, a dispersant, a photoacid, or a quencher. The addition of the another component with a different performance can effectively improve the overall performance of the patterning material. In this implementation of this application, when the main material is 100 parts by weight, the another component may be 0.1 part to 40 parts by weight.

In this implementation of this application, the patterning material is sensitive to 1 nm to 15 nm X-rays, and exposure energy required to act on the patterning material during patterning is less than 100 $mJ/cm^2$. The high sensitivity can enable patterning of the patterning material at low exposure energy, and can implement patterning by using a thin film layer of the patterning material, and exposure time can be short, to improve the patterning efficiency.

According to a second aspect, an embodiment of this application further provides a patterned film, where the patterned film is formed by using the patterning material in the first aspect of embodiments of this application. The patterned film may be used as a high-precision mask plate in a patterning process for manufacturing an integrated circuit, and a pattern of the patterned film may be transferred to a substrate such as a silicon wafer in an etching manner, to form a preset pattern on the substrate.

The patterning material in this embodiment of this application has high sensitivity to light in an X-ray wavelength range of 1 nm to 15 nm, and the molecular size may be controlled to be small. Therefore, when the patterning material provided in this embodiment of this application is irradiated by 1 nm to 15 nm soft X-rays as an exposure light source, the pattern of the patterned film obtained by patterning process procedures such as drying and development has high resolution and low edge roughness. Specifically, in this implementation of this application, the resolution of a pattern on the patterned film is in a range of 0.2 nm to 100 nm. The edge roughness is in a range of 2% to 30% of the resolution.

A third aspect of embodiments of this application further provides a pattern forming method, including:

coating the patterning material in the first aspect of embodiments of this application on a substrate, to form a patterning material film layer on the substrate;

exposing the patterning material film layer to an exposure light source by using a photomask; and developing the exposed patterning material film layer by using a developer, to form a patterned film on the substrate.

In this implementation of this application, the pattern forming method further includes etching the substrate after development, and transferring a pattern of the patterned film onto the substrate. In this implementation of this application, the substrate may be a silicon wafer, or may be a silicon substrate on which a metal layer, a dielectric layer, a surface modification layer, or an accessory layer is disposed.

In this implementation of this application, the pattern forming method further includes baking the patterning material film layer after exposure and before development, and a temperature of the baking is between 60° C. and 200° C. within a time of 20 s to 120 s. This baking operation can promote further completion of an uncompleted chemical reaction in the film layer.

In this implementation of this application, the exposure light source is 1 nm to 15 nm X-rays. In this implementation of this application, exposure energy of the exposure light source is less than 100 $mJ/cm^2$.

An embodiment of this application further provides a method for preparing an electronic component, including the pattern forming method in the third aspect of embodiments of this application, where the electronic component has a pattern formed by the patterned film. The electronic component includes a chip, and the like.

In the patterning material provided in embodiments of this application, the polysiloxane having a specific structure is used as the main material. Because the polysiloxane having the specific structure has high sensitivity and high etching resistance to 1 nm to 15 nm X-rays, and has a small molecular size, when the patterning material in embodiments of this application is used in the patterning process, a high-quality pattern with high resolution and low edge roughness can be formed under irradiation of the exposure light source: the 1 nm to 15 nm soft X-rays.

DESCRIPTION OF EMBODIMENTS

Figure 1:
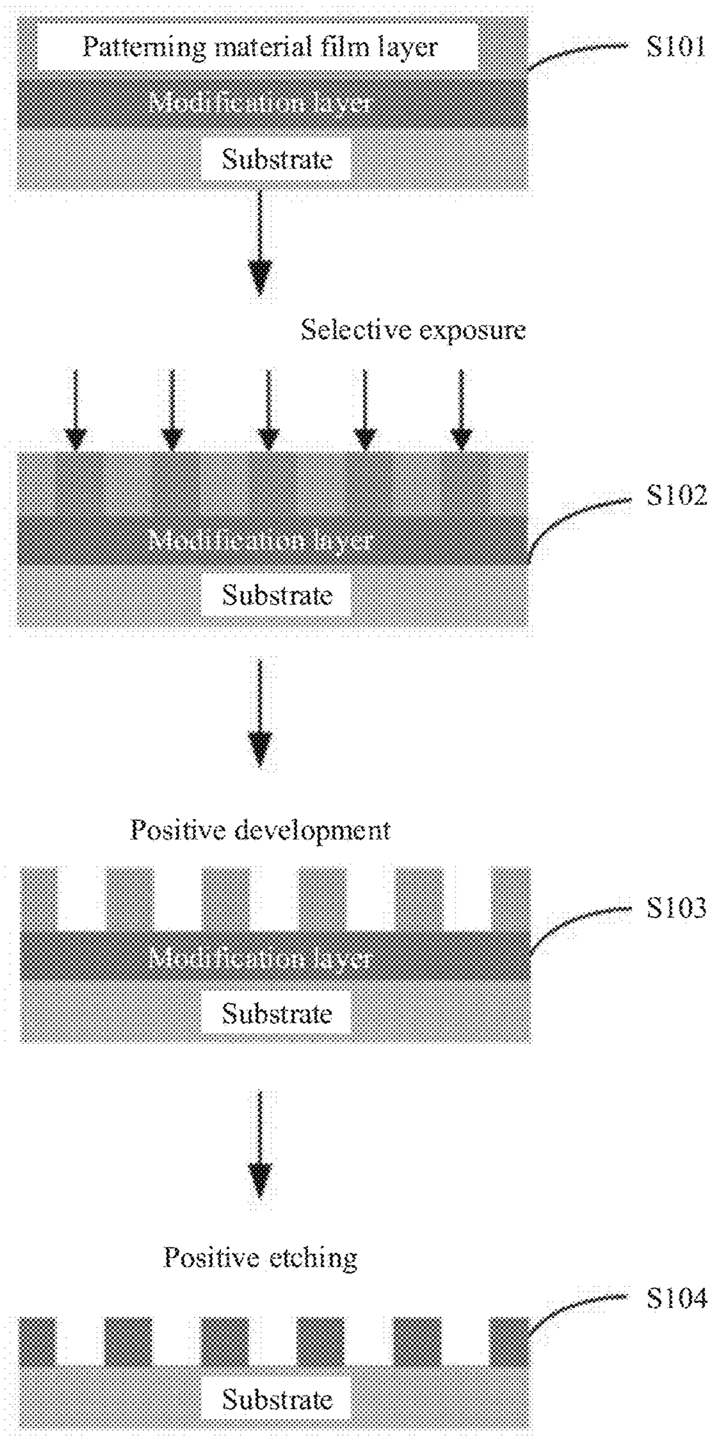
FIG. 1 is a schematic flowchart of a patterning process according to an embodiment of this application.

The following describes embodiments of this application with reference to the accompanying drawings in embodiments of this application.

At present, the most important process procedure in chip production is a patterning process procedure. The patterning process procedure is a process as follows: A light source irradiates, through a photomask plate, a surface of a substrate attached with a layer of patterning materials film, causing a chemical reaction to patterning material in an exposed region, and then the patterning material in the exposed region or in an unexposed region is dissolved and removed by using a development technology (the former is referred to as positive patterning material, and the latter is referred to as negative patterning material), so that a pattern on the photomask plate is copied onto the patterning material film, and finally, the pattern is transferred onto the substrate by using an etching technology. The use of an exposure light source: 1 nm to 15 nm soft X-rays is the most important technical element in the patterning process, but an existing patterning material cannot meet both requirements of high sensitivity and high pattern resolution under this exposure light source. In view of this, an embodiment of this application provides a patterning material that has high sensitivity and high pattern resolution under irradiation of 1 nm to 15 nm soft X-rays, and can implement an efficient and high-quality patterning process.

Specifically, the patterning material provided in this embodiment of this application includes polysiloxane. The polysiloxane includes at least one cyclic structure formed by Si—O bond repetitions and an organic group connected to a Si atom in the cyclic structure. A part of Si atoms in the at least one cyclic structure are substituted by a metal element, and/or at least one organic group includes a halogen element. The cyclic structure formed by Si—O bond repetitions is the cyclic structure formed by alternating bonding of silicon atoms and oxygen atoms.

In some implementations of this application, the part of Si atoms in the at least one cyclic structure are substituted by the metal element. To be specific, the Si atoms in the cyclic structure are substituted by the metal element, and no halogen is introduced into the organic group. The metal element includes one or more of a transition metal element, a third main group metal element, a fourth main group metal element, a fifth main group metal element, or a sixth main group metal element. The metal element has abundant outer electrons, which may interact with soft X-ray photons and excite high-energy photoelectrons. The interaction between the high-energy photoelectrons and surrounding atoms, molecules, and chemical bonds promotes occurrence of a chemical reaction, that is, promotes a chemical change, leading to a change of final solubility of the patterning material. The metal element may be specifically, for example, one or more of Sn, Hf, Zr, Ti, or Sb.

In some other implementations of this application, the at least one organic group includes a halogen element. To be specific, the halogen element is introduced into the organic group, and no metal element substitution is performed on the Si atoms in the cyclic structure. At least one organic group in all the cyclic structures in a polysiloxane molecule includes a halogen element. The introduction of the halogen element can improve the sensitivity of the patterning material under the soft X-ray exposure light source. Specifically, the halogen element has higher absorption efficiency for photons in a soft X-ray wavelength range than the C, H, O and Si elements under a soft X-ray exposure condition. When the photons are absorbed by the halogen element and inner electrons are excited, electron holes are formed, to further form free radicals and a large quantity of high energy free electrons in the process of energy dissipation (the electron energy is usually between 10 eV and 100 eV, specifically depending on incident photon energy). The free radicals and the high energy free electrons interact with surrounding chemical bonds and chemical groups, resulting in chemical bond breaking and new chemical bond generation processes, leading to the change of molecular chemical properties and further the change of solubility, thereby possessing the basic action mechanism of the patterning material. In this implementation of this application, at least one organic group connected to the Si atom includes a halogen element. When the polysiloxane includes a plurality of organic groups, some of the organic groups may include halogen elements, or all of the organic groups may include halogen elements. Compared with the metal element introduction solution, the introduction of the halogen element can avoid the risk of substrate contamination that may be caused by the introduction of the metal element.

In some other implementations of this application, the part of Si atoms in the cyclic structure are substituted by the metal element. In addition, the at least one organic group includes a halogen element. The substitution by the metal element in the cyclic structure and the introduction of the halogen element into the organic group can effectively enhance the photosensitivity of the patterning material by double effects.

In this implementation of this application, the polysiloxane has a nanoscale size. In some implementations, a molecular size of the polysiloxane is 0.2 nm to 5 nm. In some other implementations, the molecular size of the polysiloxane is 0.5 nm to 4 nm, 1 nm to 3 nm, or 2 nm to 2.5 nm. A small molecular size is beneficial to obtaining a high-quality pattern with high resolution and low edge roughness. Specifically, when the molecular size is small, during a chemical change, a size of a new structure formed by aggregation of a plurality of structural units is small, and a size of a new structure formed after a single structural unit is destroyed is smaller, thereby facilitating formation of a high-precision pattern and improving controllability of pattern edge roughness. In this implementation of this application, a molecular weight of the polysiloxane may be 130 to 400000.

In this implementation of this application, the polysiloxane may have one cyclic structure or a plurality of cyclic structures. To be specific, the polysiloxane may have a monocyclic structure or a polycyclic structure. The monocyclic structure means that there is only one cyclic structure formed by Si—O bond repetitions in the entire polysiloxane molecular structure. The polycyclic structure means that there are a plurality of cyclic structures formed by Si—O bond repetitions in the entire polysiloxane molecular structure. Connection manners of the plurality of rings may be different, and the polycyclic structure may be specifically a spiro structure, a condensed ring structure, a polyhedral structure (that is, a cage structure), or the like.

In this implementation of this application, in the cyclic structure, one or more Si atoms are connected to the at least one organic group. To be specific, in the cyclic structure, only one Si atom may be connected to an organic group, or a plurality of Si atoms are all connected to organic groups, and each Si atom may be connected to one organic group, or may be connected to two organic groups. The solubility of the patterning material can be enhanced by increasing the quantity of organic groups.

In some implementations of this application, the polysiloxane has a monocyclic structure, and a molecular main structure of the polysiloxane is shown in Formula (I):

Formula (I)

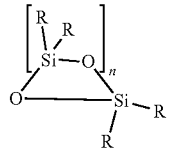

In Formula (I), R is the organic group, a plurality of Rs may be same or different organic groups, n is an integer greater than or equal to 1, the part of Si atoms in the cyclic structure are substituted by the metal element, and/or the at least one organic group R includes a halogen element. One or more organic groups in the plurality of organic groups may include a halogen element. In some implementations, n may be an integer in a range of 2 to 8, and is specifically, for example, 2, 3, 4, 5, 6, 7, or 8.

In some other implementations of this application, the polysiloxane has a polycyclic structure, and a molecular main structure of the polysiloxane is shown in Formula (II):

Formula (II)

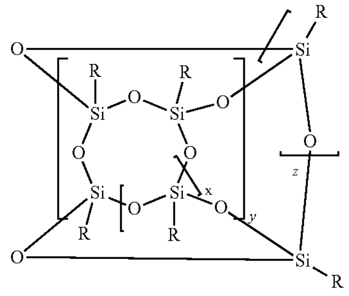

In Formula (II), R is the organic group, a plurality of Rs may be same or different organic groups, x is an integer greater than or equal to 0, y is an integer greater than or equal to 1, z is an integer greater than or equal to 0, the part of Si atoms in the at least one cyclic structure are substituted by the metal element, and/or the at least one organic group R includes a halogen element. It may be understood that when the polysiloxane has a polycyclic structure, some Si atoms in some or all cyclic structures may be substituted by a metal element. Similarly, one or more of a plurality of organic groups may include a halogen element. In some implementations, x may be an integer in a range of 1 to 3, and is specifically 1, 2, or 3; y may be an integer in a range of 1 to 5, and is specifically 1, 2, 3, 4, or 5; and z may be an integer in the range of 1 to 5, and is specifically 1, 2, 3, 4, or 5.

In some other implementations of this application, the polysiloxane has a monocyclic structure or a polycyclic structure, and a molecular main structure of the polysiloxane is shown in Formula (III):

Formula (III)

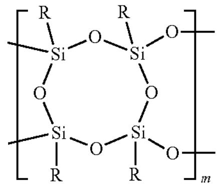

In Formula (III), R is the organic group, m is an integer greater than or equal to 1, the part of Si atoms in the at least one cyclic structure are substituted by the metal element, and/or the at least one organic group R includes a halogen element. It may be understood that when the polysiloxane has a polycyclic structure, some Si atoms in some or all cyclic structures may be substituted by a metal element. Similarly, one or more of a plurality of organic groups may include a halogen element. In some implementations, m may be an integer in a range of 2 to 8, and the polysiloxane has a polycyclic structure, and m is specifically 2, 3, 4, 5, 6, 7, or 8.

In some implementations of this application, the polysiloxane may also have an incompletely looped structure formed by Si—O bond repetitions when having one or more cyclic structures formed by Si—O repetitions. This is equivalent to non-bonding of silicon-oxygen in some cyclic structures in the polycyclic structure polysiloxane shown in Formula (II) and Formula (III). Specifically, the polysiloxane with this structure includes but is not limited to the polysiloxane shown in Formula (IV):

Formula (IV)

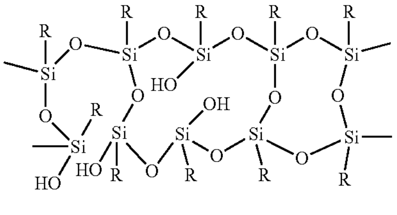

In Formula (IV), R is the organic group, a plurality of Rs may be same or different organic groups, the part of Si atoms in the at least one cyclic structure are substituted by the metal element, and/or the at least one organic group R includes a halogen element.

In this implementation of this application, a general formula of the polysiloxane may be represented as $Si_aO_bM_cR_d$, where M represents the metal element substituting the Si atoms in the cyclic structure, R represents the organic group connected to the Si atom, a and d are integers greater than or equal to 1, b is an integer greater than or equal to 2, c is an integer greater than or equal to 0, and a+c≥2. When d is greater than or equal to 2, a plurality of Rs may be same or different groups. In some implementations of this application, a+c≥3, and b is an integer greater than or equal to 3.

In this implementation of this application, an element composition of the organic group may be $C_eH_fX_gO_hN_iP_jS_oSi_pM'_q$, where X is a halogen atom, M' represents a second metal element, e is an integer greater than or equal to 1, f, g, h, i, j, o, p, and q are integers greater than or equal to 0, and (f+g+h+i+j+o+p+q)≥e. M' may be one or more of a transition metal element, a third main group metal element, a fourth main group metal element, a fifth main group metal element, or a sixth main group metal element. Specifically, M' may be, for example, Sn, Hf, Zr, Ti, or Sb. In this implementation of this application, to better control the overall molecular size of the polysiloxane, a quantity of carbon atoms of the organic group may be controlled within a range of 1 to 20, that is, e may be an integer in a range of 1 to 20.

In this implementation of this application, the organic group may be a substituted or unsubstituted hydrocarbyl, a substituted or unsubstituted oxyl, an organosilicon group, or an organic group including a metal atom. In this implementation of this application, the organic group may include a hydroxyl, a cyano, a carbonyl, a carboxyl, an ether bond, an ester bond, a sulfonic ester bond, a carbonic acid, a lactonic ring, a sultone ring, a carboxylic acid anhydride, or the like. In some implementations of this application, the polysiloxane includes a plurality of organic groups, and the plurality of organic groups may be same or different substituted or unsubstituted hydrocarbyls, substituted or unsubstituted oxyls, organosilicon groups, or organic groups including metal atoms. In this application, the substituted or unsubstituted hydrocarbyl may be a straight chain hydrocarbyl or a branched chain hydrocarbyl, a saturated or unsaturated hydrocarbyl, or a cyclic hydrocarbyl including one or more cycles. Specifically, the substituted or unsubstituted hydrocarbyl may be a substituted or unsubstituted alkyl, a substituted or unsubstituted alkenyl, a substituted or unsubstituted alkynyl, a substituted or unsubstituted aryl (for example, a phenyl, or a naphthyl), a substituted or unsubstituted aralkyl (for example, a benzyl, or a phenethyl), a substituted or unsubstituted arylalkenyl, a substituted or unsubstituted arylenealkyne, a substituted or unsubstituted alkaryl (tolyl), a substituted or unsubstituted allylaryl, a substituted or unsubstituted alkynylaryl, or the like. A substituent group in the substituted hydrocarbyl may be a halogen atom, an oxygen atom, an oxygen atom containing group, a nitrogen atom containing group, a sulfur atom containing group, or the like, to form, for example, a hydroxyl, an ether, an ester, an acid anhydride, an aldehyde, a ketone, a carboxylic acid, or the like. The substituted hydrocarbyl may be specifically, for example, a halogenated hydrocarbyl, an aldehyde based alkyl, a carboxy alkyl, a hydroxyalky, an ester based alkyl, an acyl-alkyl, an aminoalkyl, an alkyl azido, or a mercaptoalkyl. The halogenated hydrocarbyl includes a halogenated alkyl, a halogenated alkenyl, a halogenated alkynyl, a halogenated aryl, a halogenated aralkyl, a halogenated arylalkenyl, or a halogenated arylenealkyne. Certainly, the substituted hydrocarbyl may also include a plurality of the foregoing different substituent groups, such as a halogenated aldehyde based alkyl, a halogenated acyl-alkyl, a halogenated mercaptoalkyl, and a halogenated aminoalkyl. In this application, the substituted or unsubstituted oxyl may be specifically a substituted or unsubstituted alkoxy, a substituted or unsubstituted allyloxy, a substituted or unsubstituted epoxy group, a substituted or unsubstituted aromatic epoxy group, or the like. The substituent group in the substituted oxyl may be a halogen atom, an oxygen atom, an oxygen atom containing group, a nitrogen atom containing group, a sulfur atom containing group, or the like. The substituted oxyl may be, for example, a halogenated oxyl. The halogenated oxyl may be, for example, a halogenated alkoxy, a halogenated allyloxy, a halogenated epoxy group, or a halogenated aromatic epoxy group.

In this implementation of this application, the group including the halogen element may be a halogenated alkyl, a halogenated alkenyl, a halogenated alkynyl, a halogenated aryl, a halogenated aralkyl, a halogenated arylalkenyl, a halogenated arylenealkyne, a halogenated aldehyde based alkyl, a halogenated acyl-alkyl, a halogenated mercaptoalkyl, a halogenated aminoalkyl, a halogenated alkoxy, a halogenated allyloxy, a halogenated epoxy group, a halogenated aromatic epoxy group, or another organic group including a halogen element.

In the foregoing halogen groups, the halogen may be F, Cl, Br, or I. The halogen group can introduce a halogen into the molecular structure of the polysiloxane, to improve the photosensitivity of the patterning material by using high absorption efficiency of the halogen element for soft X-ray photons. In another implementation, the substituted hydrocarbyl may also include another substituent.

In this implementation of this application, the organic group includes an end group having reactive activity. In some implementations of this application, the end group may be, for example, a hydroxyl, a carboxyl, an aldehyde group, an amino, a saturated hydrocarbyl, an unsaturated hydrocarbyl, an azido, a sulfhydryl, or an epoxy group. The end group has the reactive activity, so that a capability of the polysiloxane to perform chemical reaction with surrounding adjacent molecules during and after exposure can be enhanced.

In some implementations of this application, the organic group R may be specifically, for example, but not limited to, an alkyl, an alkenyl, an alkynyl, or an aryl with 1 to 20 carbon atoms, or the following groups:

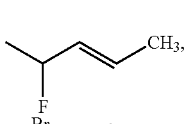
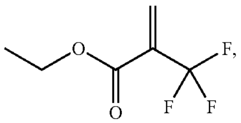
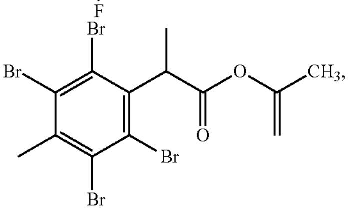
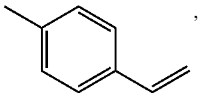
,
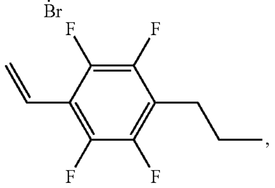
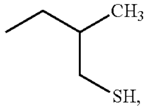
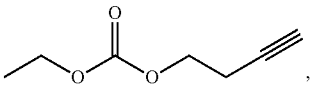
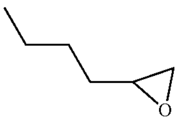
, and
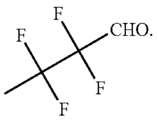

In this implementation of this application, in the organic group, an atom directly connected to the Si atom may be a halogen atom, an O atom, a C atom, a N atom, a P atom, a S atom, or a Si atom. A stable chemical bond is formed between these atoms and the Si atom in the cyclic structure, so that the organic group is stably bonded to the cyclic structure.

In some implementations of this application, the molecular main structure of the polysiloxane may be shown in Formula (A) to Formula (G):

(A)
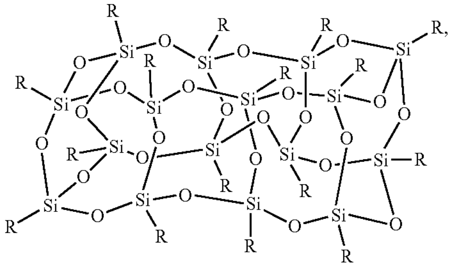

(B)
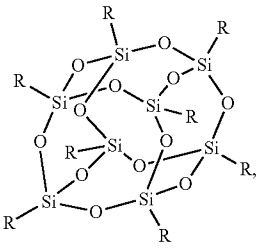

(C)
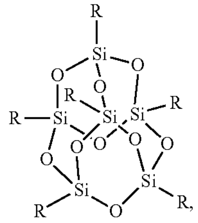

(D)
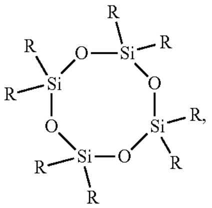

(E)
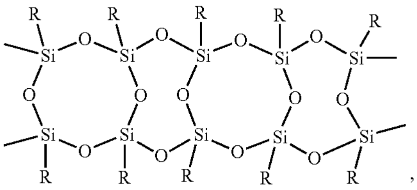
, (F)
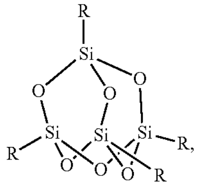
and

-continued (G)

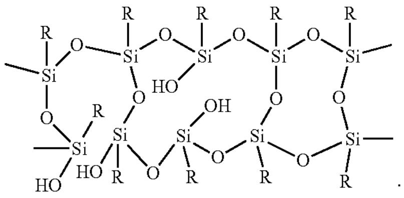

In Formula (A) to Formula (G), R is an organic group, and a plurality of Rs may be same or different organic groups. In Formula (A) to Formula (G), a part of Si atoms in the at least one cyclic structure are substituted by a metal element, and/or the at least one organic group includes a halogen element. It may be understood that, when a plurality of cyclic structures are included, some Si atoms in some or all of the cyclic structures may be substituted by the metal element. Similarly, when a plurality of organic groups are included, one or more organic groups may include a halogen element.

In this implementation of this application, the patterning material further includes a solvent, and the solvent may be one or more of organic solvents such as an aliphatic hydrocarbon organic solvent, an aromatic hydrocarbon organic solvent, an alicyclic hydrocarbon organic solvent, a halogenated hydrocarbon organic solvent, an alcohol organic solvent, an ether organic solvent, an ester organic solvent, a ketone organic solvent, a diol derivative, acetonitrile, or pyridine. The solvent can dissolve the polysiloxane to form a coating material. The polysiloxane in this embodiment of this application has good solubility, can be dissolved in most organic solvents, and has good coating performance as a patterning material. A surface of a film layer of the formed patterning material is smooth, a thickness of the film is easy for adjustment, and a development condition meets a requirement of a patterning process, to facilitate application.

In this implementation of this application, excluding the solvent, a mass of the polysiloxane in the patterning material accounts for greater than 50%. Large polysiloxane content can effectively ensure high efficiency and high quality of the patterning process. Specifically, excluding the solvent, the mass of the polysiloxane in the patterning material may account for 55% to 99%, 60% to 90%, and 70% to 80%.

In this implementation of this application, the patterning material may further include another component as required, and the another component may include one or more of a stabilizer, a dispersant, a photoacid, or a quencher. In this implementation of this application, when the main material is 100 parts by weight, the another component may be 0.1 part to 40 parts by weight. In some implementations, when the main material is 100 parts by weight, the another component may be 1 to 30 parts by weight or 5 to 20 parts by weight.

In this implementation of this application, the patterning material is sensitive to 1 nm to 15 nm X-rays, and exposure energy required to act on the patterning material during patterning is less than 100 $mJ/cm^2$. The high sensitivity can enable patterning of the patterning material at low exposure energy, and can implement patterning by using a thin film layer of the patterning material, and exposure time can be short, to improve the patterning efficiency. In this implementation of this application, the patterning material may have high sensitivity to an X-ray light source with any wavelength in a range of 1 nm to 15 nm, and the wavelength may be specifically 1 nm to 13.5 nm, 1 nm to 10 nm, 1 nm to 7 nm, and 3 nm to 5 nm. In some implementations of this application, exposure energy required to act on the patterning material may be 0.5 $mJ/cm^2$ to 50 $mJ/cm^2$.

In this implementation of this application, different compound raw materials may be selected based on different structures of the polysiloxane, and preparation is performed by using different methods. The preparation method is simple and can be used for industrial production. Specifically, one or more siloxane monomers may be used for condensation under acidic or alkaline conditions. The synthetic monomer of the polysiloxane of this application may be selected from: hydrogenalkoxysilane (a) or trichlorosilane (d) with a single organic ligand functional group, organo-bis-alkoxysilane (b) or dichlorosilane (e) with double organic ligand functional groups, triallyl-alkoxysilane (c) or chlorsilane (f) with three organic ligand functional groups, or a mixture of the foregoing two or three monomers.

(a)

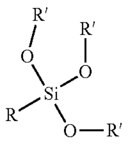

(b)

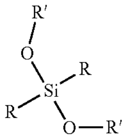

(c)

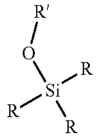

(d)

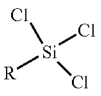

(e)

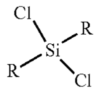

(f)

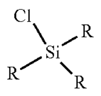

In Formula (a) to Formula (f), R is an organic group directly connected to Si, and a plurality of Rs may be same or different organic groups. In Formulas (a) to (c), R' may be, but is not limited to, an alkyl having 1 to 20 carbon atoms.

Using acidic condition synthesis as an example, a preparation process of the polysiloxane in this application may be as follows: Under a mechanical stirring condition, anhydrous ferric trichloride is added into a round bottom flask, and then concentrated hydrochloric acid, methanol, petroleum ether, and dichloromethane are added. One or more siloxane monomers (which may be ethoxysilane or chlorosilane) are selected, where selection of the monomers and a molar ratio are determined by a final material structure. The monomers are uniformly dissolved in petroleum ether with a volume dose of five times to 20 times. A solution containing the monomers is placed in a constant pressure dropping funnel. The solution is dripped into the round bottom flask reactor within 5 h to 20 h. Continuous stirring and reaction are performed for 15 h to 48 h at room temperature, then reaction is performed for 5 h to 15 h at 60° C. After sufficient reaction is performed, filtering and solution separation are performed, and an upper organic layer is transferred to the round bottom flask. Sodium carbonate and calcium chloride are added to remove acid, stirring is performed for 10 h to 20 h, filtering is performed, a filtrate is decompressed and concentrated by using a rotary evaporator, and is placed in a 4° C. refrigerator for cold storage crystallization. A precipitated crystal is recrystallized by using a mixed solution of dichloromethane and ethanol, and a target product that includes at least one cyclic structure formed by Si—O bond repetitions and that has an organic group in a monomer is obtained by purification.

In this implementation of this application, the synthesized polysiloxane may be further modified, and the end group may be selectively modified, to implement preparation of polysiloxane having a plurality of different organic groups. Alternatively, polysiloxane such as octavinyl-T8-silsesquioxane may be directly purchased from the market, and its organic group vinyl may be used to react with a hydrogen siloxane group under Pt catalysis, and hydrogen siloxane modified by different organic groups is selected to react with the vinyl, to perform end group modification on the vinyl.

The patterning material in this embodiment of this application uses the polysiloxane as the main material, and the polysiloxane has a cyclic structure. The cyclic structure can well control the molecular size, so that the polysiloxane has a small molecular size, thereby improving the resolution of a pattern obtained by using the patterning process, and reducing edge roughness of the pattern. In this way, problems of low quality and insufficient resolution of the formed pattern due to high edge roughness of the pattern caused by a large molecular size of the patterning material are avoided. In addition, the photosensitivity of the patterning material can be improved by introducing a metal element and/or halogen elements into the molecular structure of the polysiloxane, so that the patterning material can be suitable for the 1 nm to 15 nm soft X-ray exposure light source, and high exposure efficiency can be obtained by using low exposure energy. The patterning material in this embodiment of this application is used to prepare an electronic component such as a chip, so that a high-quality pattern can be obtained, and precision and preparation efficiency of the component can be improved.

Correspondingly, an embodiment of this application further provides a patterned film, which is formed by using the patterning material in embodiments of this application. The patterned film may be used as a high-precision mask plate in a patterning process for manufacturing an integrated circuit, and a pattern of the patterned film may be transferred to a substrate such as a silicon wafer in an etching manner, to form a preset pattern on the substrate. The patterning material in this embodiment of this application has high sensitivity to light in a wavelength range of 1 nm to 15 nm, and the molecular size may be controlled to be small. Therefore, when the patterning material provided in this embodiment of this application is irradiated by 1 nm to 15 nm soft X-rays as an exposure light source, the pattern of the patterned film obtained by patterning process procedures such as drying and development has high resolution and low edge roughness. Specifically, in this implementation of this application, the resolution of a pattern on the patterned film is in a range of 0.2 nm to 100 nm. The edge roughness is 2% to 30% of the resolution. In some implementations, the resolution of the pattern may be 3 nm to 80 nm. In some other implementations, the resolution of the pattern may be 5 nm to 50 nm. In some other implementations, the resolution of the pattern may be 10 nm to 20 nm.

Figure 2:
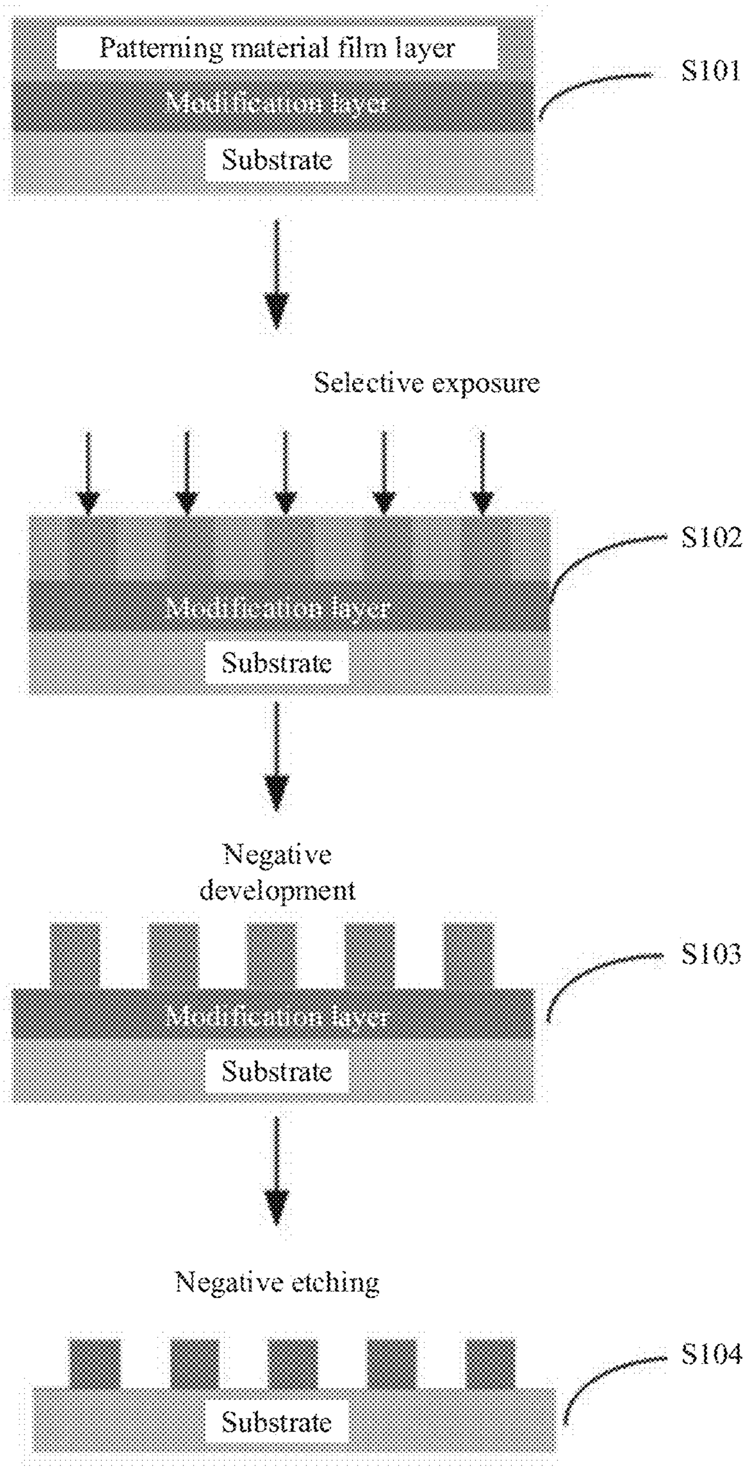
FIG. 2 is a schematic flowchart of a patterning process according to another embodiment of this application.

An embodiment of this application further provides a pattern forming method. As shown in FIG. 1 and FIG. 2, a patterning process of the pattern forming method includes the following steps.

S101: Coat the patterning material in embodiments of this application on a substrate, to form a patterning material film layer on the substrate.

Specifically, one or more polysiloxanes in embodiments of this application may be mixed based on a proportion, and dissolved in a suitable solvent to form a solution with a particular concentration, where one or more other components of a stabilizer, a dispersant, a photoacid, a quencher, and the like may be selectively added to the solution. In this implementation of this application, the solvent may be one or more of organic solvents such as an aliphatic hydrocarbon organic solvent, an aromatic hydrocarbon organic solvent, an alicyclic hydrocarbon organic solvent, a halogenated hydrocarbon organic solvent, an alcohol organic solvent, an ether organic solvent, an ester organic solvent, a ketone organic solvent, a diol derivative, acetonitrile, or pyridine. In this implementation of this application, excluding the solvent, when the polysiloxane is 100 parts by weight, the another component may be 0.1 part to 40 parts by weight. An adding amount of the solvent may be adjusted based on a film layer thickness requirement, and usually, a higher concentration of the solution corresponds to a thicker film layer.

In this implementation of this application, the substrate may be selected based on a specific requirement, and may be a silicon wafer, or a silicon wafer covered by another coating layer. The another coating layer may be an anti-reflection coating layer, an anti-etching coating layer, an epitaxial layer, a metal layer, a dielectric layer, a surface modification layer, or an accessory layer. Usually, the another coating layer may be obtained by preprocessing the substrate, and a preprocessing manner may be: performing surface hydrophilic activation on the silicon wafer substrate by using $O_2$ plasmas, or performing surface hydrophobic processing on the substrate by using hexamethyldisilazane (HMDS), or adding a bottom anti-reflection coating (BARC), a spin on carbon (SOC), and a spin on glass (SOG).

Based on the size of the substrate, a solution with a particular volume dose is coated on the substrate by using a spin coating process, to form a patterning material film layer with a thickness less than 100 nm. Specifically, the thickness of the film layer may be, for example, 0.2 nm to 40 nm. The surface roughness of the film layer may be less than 2 nm. Because the polysiloxane in embodiments of this application has high sensitivity, a small thickness may be set to achieve high quality patterning.

In this implementation of this application, after spin coating and before exposure, the solvent remaining in the patterning material film layer may be selectively removed by using a baking process. A baking temperature may be between 60° C. and 200° C. and a baking time is between 20 s and 120 s.

S102: Expose the patterning material film layer to an exposure light source by using a photomask.

Specifically, the patterning material film layer may be selectively irradiated by any single wavelength ray or mixed wavelength ray within the X-ray range of 1 nm to 15 nm after mask plate reflection, and the pattern on the mask plate is transferred to the patterning material film layer. Exposure energy of the exposure light source may be less than 100 mJ/cm$^2$. After the patterning material film layer is selectively exposed to the soft X-ray light source in the wavelength range of 1 nm to 15 nm, the exposed part undergoes a chemical reaction and the solubility changes.

In this implementation of this application, the patterning material film layer may be selectively baked after exposure and before development, and a temperature of the baking is between 60° C. and 200° C. within a time of 20 s to 120 s. This baking operation can promote further completion of an uncompleted chemical reaction in the film layer.

S103: Develop the exposed patterning material film layer by using a developer, to form a patterned film on the substrate.

Because the chemical property of the exposed part of the patterning material film layer changes and the solubility changes, the irradiated patterning material is cleaned by a developer, and a cleaning time ranges from 10 s to 300 s. Cleaning may be single-step or multi-step cleaning. After cleaning, the irradiated part of the patterning material film layer is cleaned off and is positively developed, to form a positive pattern, and the patterning material is referred to as a positive patterning material, as shown in FIG. 1. The irradiated part is not cleaned away and is negatively developed, to form a negative pattern. The patterning material is referred to as a negative patterning material, as shown in FIG. 2.

In the development process, a suitable developer may be selected based on the property of the patterning material, and the developer may be selected from an organic solution, an inorganic solution, a pure solvent, a mixed solvent, a solvent including additives, and the like. Specifically, in some implementations of this application, the developer may be a tetramethylammonium hydroxide (TMAH) aqueous solution with a concentration of 0.5% to 5%, or may be an organic solvent such as a ketone organic solvent, an alcohol organic solvent, an ether organic solvent, an ester organic solvent, a lactone organic solvent, or a high boiling point alcohol organic solvent. The ketone organic solvent may be, for example, cyclohexanone and methyl-2-amyl ketone; the alcohol organic solvent may be, for example, 3-methoxybutanol, 3-methyl-3-methoxybutanol, 1-methoxy-2-propanol, 1-ethyoxyl-2-propanol, and diacetone alcohol; the ether organic solvent may be, for example, propylene glycol monomethyl ether, ethylene glycol monomethyl ether, propylene glycol monoethyl ether, ethylene glycol monoethyl ether, propylene glycol dimethyl ether, and diethylene glycol dimethyl ether; the ester organic solvent may be, for example, propylene glycol monomethyl ether acetate (PGMEA), propylene glycol monoethyl ether acetate, ethyl lactate, ethyl pyruvate, butyl acetate, 3-ethyoxyl methyl propionate, 3-ethyoxyl ethyl propionate, tert-butyl acetate, tert-butyl propionate, and propylene glycol mono-tert-butyl ether acetate; the lactone organic solvent may be for example, γ-butyrolactone; and the high boiling point alcohol solvent may be, for example, diethylene glycol, propylene glycol, glycerin, 1,4-butanediol, and 1,3-butanediol. The developer may be a mixture of one or more of the foregoing solvents. A time for contact between the developer solution and the exposed film layer for development may be 20 s to 120 s. After the development, a water rinsing process may be selectively added, and a rinsing time may be 20 s to 120 s. A baking process may also be selectively added, a baking temperature may be between 60° C. and 200° C., and a baking time may be between 20 s and 120 s.

After the development, the resolution of the obtained pattern is between 0.2 nm and 100 nm, and the edge roughness is between 2% and 30% of the pattern resolution. In some implementations of this application, a pattern with a resolution of 0.2 nm to 20 nm may be obtained.

S104: Etch the substrate after development, and transfer a pattern of the patterned film onto the substrate.

The pattern formed by the patterning material forms a selective protection function for the underlying substrate material in the etching step, and the patterning material and the unprotected substrate material are etched by etching under a particular condition, but the etching speed of a position protected by the patterning material is slower than that of an unprotected position, and finally, the pattern is formed on the substrate material. In the etching process, HF etching, ion etching, or ion implantation processes may be specifically performed, to transfer the pattern onto the substrate.

An embodiment of this application further provides a method for preparing an electronic component, including the pattern forming method in embodiments of this application, where the electronic component has a pattern formed by the patterned film. The electronic component may include a chip, and the like. In a process of preparing the chip, other functional layers may be prepared after a patterning process is completed.

The following describes the technical solutions in embodiments of this application in detail by using specific embodiments.

Embodiment 1

(1) 1 mol part of p-fluorobenzodialdehyde, 2.4 mol parts of methyltriphenylphosphonium bromide, and 2.9 mol parts of potassium tert-butoxide are added into an anhydrous and oxygen-free tetrahydrofuran (THF) solvent, and stirring is performed for 4 h under argon protection at room temperature. After rotary evaporation, extraction by using water and diethyl ether is performed. An organic layer is dried by using magnesium sulfate $MgSO_4$, and is dissolved in n-hexane, and a liquid obtained by rotary evaporation and concentration is purified by passing through a chromatographic column, to obtain p-fluorobenzenediene.

(2) 1.2 mol parts of trichlorosilane and 1 mol part of p-fluorobenzenediene that is obtained in step (1) are refluxed for reaction for 6 h in the THE solvent at 80° C. under a condition of 0.04 mol part of an $H_2PtCl_6$ catalyst. Trichlorosilane monomers are obtained after reduced pressure distillation.

A synthetic route of step (1) and step (2) is shown in Formula (V):

Formula (V)

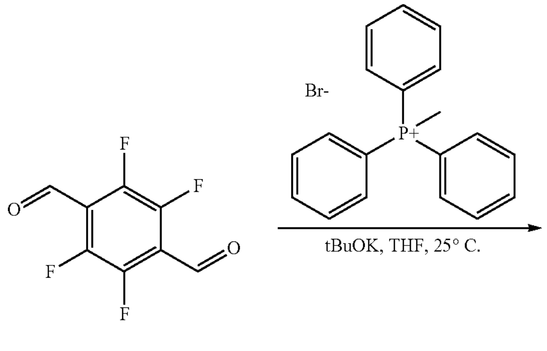

-continued

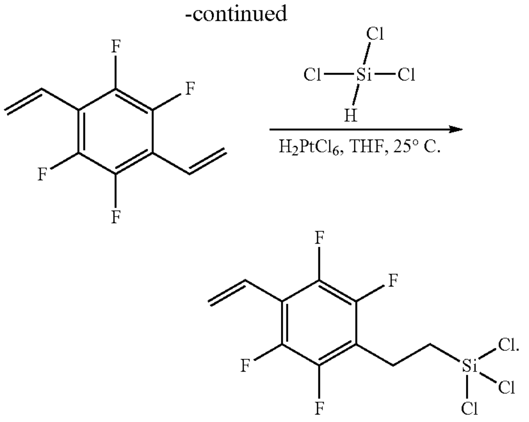

(3) 1.6 mol parts of anhydrous $FeCl_3$ and 2 mol parts of concentrated hydrochloric acid are added into a three-port flask, and are mechanically stirred and dissolved in a mixed solvent of methanol, petroleum ether, and dichloromethane with a volume ratio of 2:4:1. 1 mol part of the trichlorosilane monomer obtained in step (2) is dissolved to prepare a petroleum ether solution with a volume fraction of 10%. The monomer solution is dripped into the three-port flask within 10 h through a constant pressure funnel, stirring is performed for 24 h at room temperature, and then reaction is performed for 10 h at 60° C. After sufficient reaction is performed, filtering and solution separation are performed, and an upper organic layer is transferred to the conical flask. Sodium carbonate and calcium chloride are added to remove acid, stirring is performed for 12 h, filtering is performed, a filtrate is decompressed and concentrated by using a rotary evaporator, and is placed in a 4° C. refrigerator for cold storage crystallization. A precipitated crystal is recrystallized by using a mixed solution of dichloromethane and ethanol, and polysiloxane is obtained by purification. The reaction route is shown in Formula (VI).

Formula (VI)

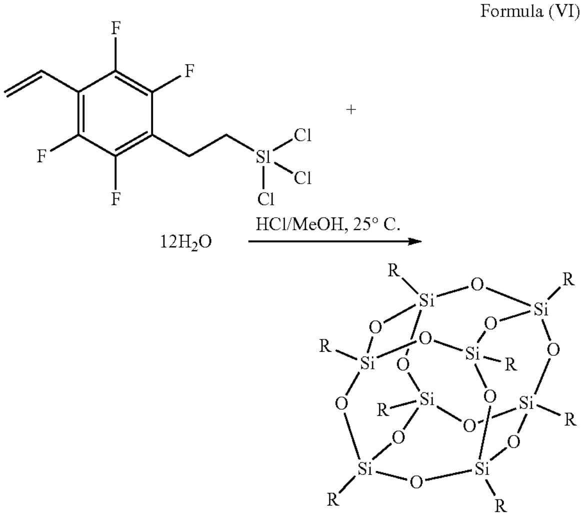

R:

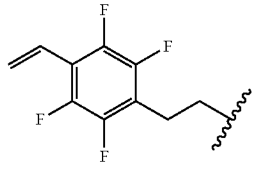

The prepared polysiloxane uses octa(cyclohexylsilsesquioxane) as the main structure and introduces p-fluorostyrene substituent groups, and the molecular size is between 0.3 nm and 0.7 nm.

(4) The p-fluorostyrene octa(cyclohexylsilsesquioxane) prepared in step (3) is dissolved in an isopropanol solution, to prepare a solution with a concentration of 10 mg/mL. The solution is filtered by using a polytetrafluoroethylene PTFE filter membrane, and is spin-coated on a silicon wafer substrate processed by HMDS, to form a patterning material film layer with a thickness of 10 nm to 30 nm. At low energy, 13.5 nm soft X-rays are selectively irradiated onto a surface of the patterning material film layer under mask plate protection. After exposure and development, the patterning material film layer can form a patterned structure less than 30 nm. This meets requirements of high sensitivity and high pattern resolution. This is because the polysiloxane of embodiments of this application has a large quantity of fluorine atoms and thus has high sensitivity to soft X-rays, and can absorb more soft X-ray photons. Double bonds connected to a fluorophenyl can accelerate a polymerization reaction by using a free radical reaction, so that the photochemical reaction efficiency is better improved, and the photosensitivity of the patterning material is further improved. Specifically, in the exposure process, the photons are mainly absorbed by a fluorobenzene ring after irradiation by rays with a wavelength of 13.5 nm, and high-energy photoelectrons are excited. The photoelectrons further initiate double bond free radical polymerization and further polymerization of a nanostructure. The reaction process is shown in Formula (VII).

Formula (VII)

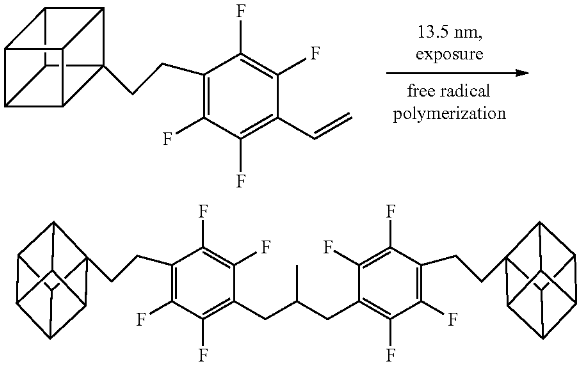

the hexahedron represents a stereostructure of the main body octa(cyclohexylsilsesquioxane), and R represents p-fluorostyrene:

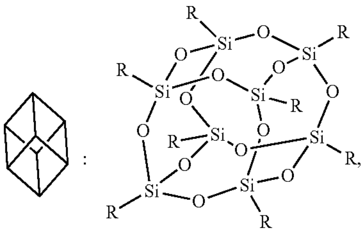

-continued

R: 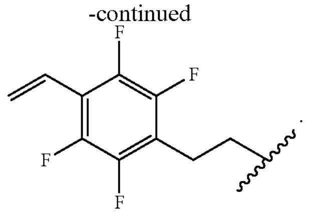

(5) After selective radiation by rays, the patterning material film layer makes a solubility change, and after cleaning by a developer made of a mixed solvent of isopropanol and water, the part that is not irradiated is cleaned away, and the part that is irradiated is kept, to form a negative pattern, thereby completing the patterning process.

(6) The silicon wafer substrate is etched by an oxygen ion etching step, to form a negative pattern on the silicon wafer substrate.

Embodiment 2

The p-fluorostyrene octa(cyclohexylsilsesquioxane) prepared in Embodiment 1 is used as a raw material, which is modified to obtain modified polysiloxane. The following specific steps are included.

(1) 10 mol parts of dimethyl thiol siloxane and 1 mol part of p-fluorostyrene octa(cyclohexylsilsesquioxane) are refluxed for reaction for 6 h in the THE solvent at 80° C. under a condition of 0.32 mol part of an $H_2PtCl_6$ catalyst. A target product can be obtained after reduced pressure distillation. A synthetic route is shown in Formula (VIII).

Formula (VIII)

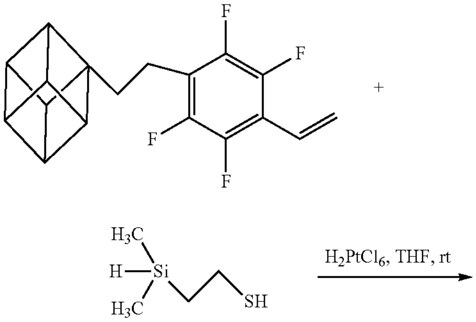

-continued

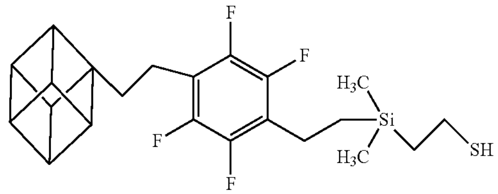

(2) The polysiloxane shown in Formula (VIII) with a sulfhydryl as an end group and the p-fluorostyrene octa (cyclohexylsilsesquioxane) that is prepared in Embodiment 1 are mixed at a molar ratio of 1:1 to prepare a main material of the patterning material, and then a process of dissolving and spin coating to form a film is performed, to form a film with a thickness of 15 nm on the silicon wafer substrate preprocessed by HMDS. At low energy, 13.5 nm soft X-rays are selectively irradiated onto a surface of the patterning material film layer under mask plate protection. After exposure and development, the patterning material film layer can form a patterned structure less than 0.2 nm to 20 nm. This meets requirements of high sensitivity and high pattern resolution. In the exposure process, free radical polymerization may occur on the polysiloxane, and the reaction mechanism is shown in the Formula (IX).

Formula (IX)

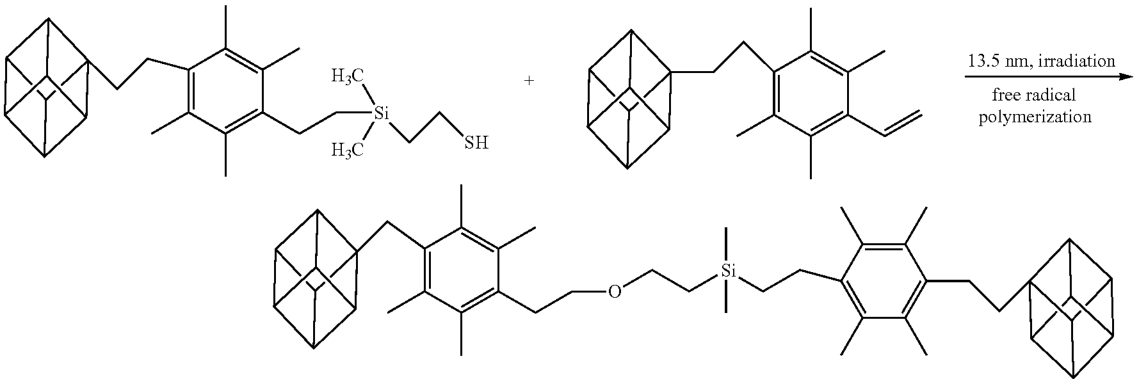

(3) After selective radiation by rays, the patterning material film layer makes a solubility change, and after cleaning by a developer made of a mixed solvent of isopropanol and water, the part that is not irradiated is cleaned away, and the part that is irradiated is kept, to form a negative pattern, thereby completing the patterning process.

(4) The silicon wafer substrate is etched by an oxygen ion etching step, to form a negative pattern on the silicon wafer substrate.

Embodiment 3

(1) 1 mol part of trihydroxy isopropyl silsesquioxane (which can be purchased on the market) and 5 mol parts of triethylamine are mixed in a three-port flask by using a tetrahydrofuran solvent; 1 mol part of isopropyl tin trichloride is dissolved in tetrahydrofuran, the isopropyl tin trichloride tetrahydrofuran solution is gradually dripped into the three-port flask under a stirring condition, and reaction is performed for 8 h to 12 h at 25° C. The obtained solution is extracted by using n-hexane and then is crystallized at −30° C. to obtain colorless crystal powder. The reaction process is shown in Formula (X):

Formula (X)

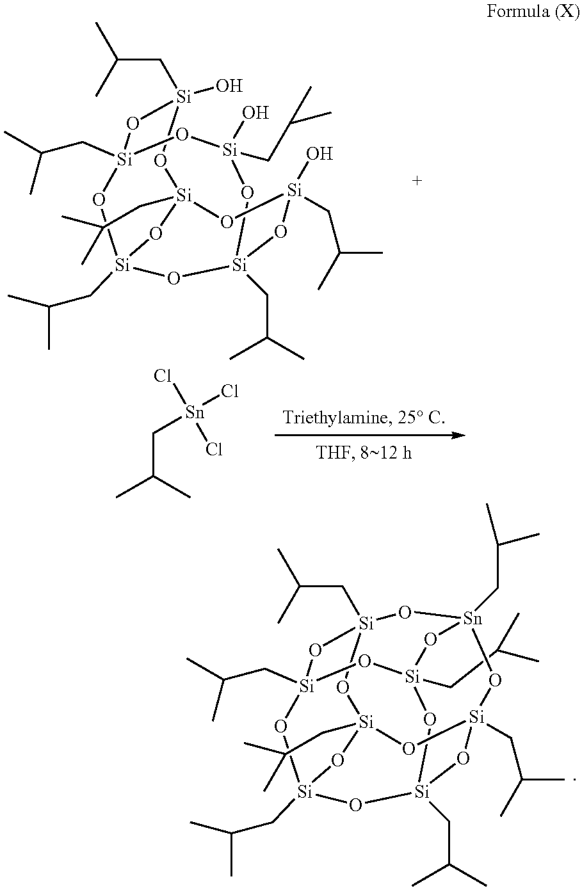

(2) The product obtained in step (1) is dissolved and spin-coated, to form a film with a thickness of 15 nm on the silicon wafer substrate preprocessed by HMDS, and the film is selectively exposed to 13.5 nm soft X-rays. In the exposure process, free radical polymerization may occur on the polysiloxane, and the reaction mechanism is shown in Formula (IX):

Formula (XI)

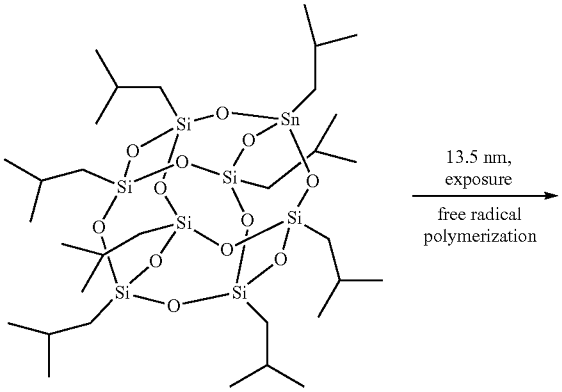

-continued

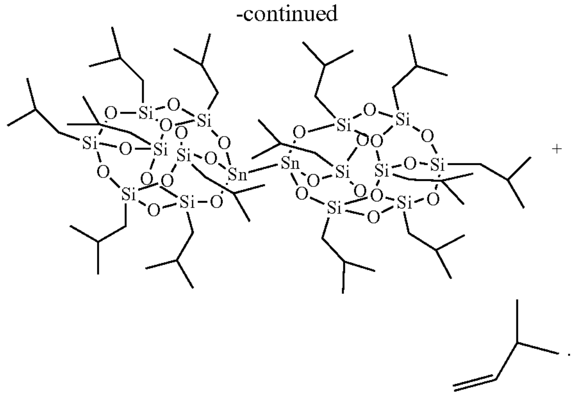

(3) After selective radiation by rays, the patterning material film layer makes a solubility change, and after cleaning by a TMAH developer, the part that is not irradiated is cleaned away, and the part that is irradiated is kept, to form a negative pattern, thereby completing the patterning process.

(4) The silicon wafer substrate is etched by an oxygen ion etching step, to form a negative pattern on the silicon wafer substrate.

In this implementation of this application, because different polysiloxanes have different mechanisms for free radical polymerization reactions after being irradiated in the film layer, chemical reaction rates are different, that is, the apparent effect causes different photosensitivities. Specifically, the organic groups may be designed with different end groups based on actual process condition requirements, to adjust the photosensitivity of the patterning material.

What is claimed is:

1. A patterning material, comprising polysiloxane, wherein the polysiloxane comprises at least one cyclic structure formed by silicon-oxygen (Si—O) bond repetitions and at least one organic group connected to a silicon (Si) atom in the at least one cyclic structure, the at least one organic group is represented by the following formula:

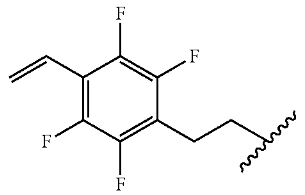 [SMILES: *CCc1c(F)c(F)c(C=C)c(F)c1F]

2. The patterning material according to claim 1, wherein a subset of Si atoms in the at least one cyclic structure are substituted by a metal element, and wherein the metal element comprises one or more of a transition metal element, a third main group metal element, a fourth main group metal element, a fifth main group metal element, or a sixth main group metal element.

3. The patterning material according to claim 1, wherein the polysiloxane has a molecular weight of 130 to 400000.

4. The patterning material according to claim 1, wherein a subset of Si atoms in the at least one cyclic structure are substituted by a metal element, and wherein a general formula of the polysiloxane is $Si_aO_bM_cR_d$, wherein M represents the metal element, R represents an organic group, a and d are integers greater than or equal to 1, b is an integer greater than or equal to 2, c is an integer greater than or equal to 0, and a+c≥2.

5. The patterning material according to claim 1, wherein the polysiloxane has a polycyclic structure.

6. The patterning material according to claim 1, wherein a subset of Si atoms in the at least one cyclic structure are substituted by a metal element, and wherein a molecular main structure of the polysiloxane is shown in Formula (I):

Formula (I)

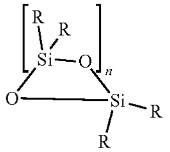

wherein in Formula (I), R is an organic group, n is an integer greater than or equal to 1, and wherein at least one of the following is satisfied:

a subset of Si atoms in at least one cyclic structure in Formula (I) are substituted by the metal element; or at least one organic group R comprises a halogen element.

7. The patterning material according to claim 1, wherein a subset of Si atoms in the at least one cyclic structure are substituted by a metal element, and wherein a molecular main structure of the polysiloxane is shown in Formula (II):

Formula (II)

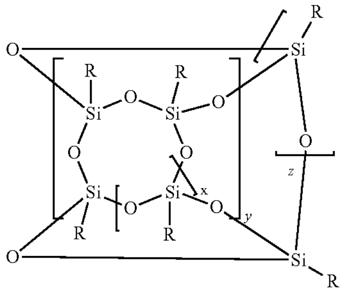

wherein in Formula (II), R is an organic group, x is an integer greater than or equal to 0, y is an integer greater than or equal to 1, z is an integer greater than or equal to 0, and wherein at least one of the following is satisfied:

a subset of Si atoms in at least one cyclic structure in Formula (II) are substituted by the metal element; or at least one organic group R comprises a halogen element.

8. The patterning material according to claim 1, wherein a subset of Si atoms in the at least one cyclic structure are substituted by a metal element, and wherein a molecular main structure of the polysiloxane is shown in Formula (III):

Formula (III)

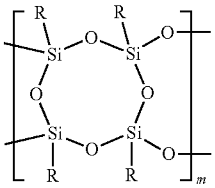

wherein in Formula (III), R is an organic group, m is an integer greater than or equal to 1, and wherein:

a subset of Si atoms in at least one cyclic structure in Formula (III) are substituted by the metal element; or at least one organic group R comprises a halogen element.

9. The patterning material according to claim 1, wherein a quantity of carbon atoms of the organic group is in a range of 1 to 20.

10. The patterning material according to claim 1, wherein the organic group is a substituted or unsubstituted hydrocarbyl, a substituted or unsubstituted oxyl, an organosilicon group, or an organic group comprising a metal atom.

11. The patterning material according to claim 1, wherein an element composition of the organic group is $C_eH_fX_gO_hN_iP_jS_oSi_pM'_q$, wherein X is a halogen atom, M' represents a second metal element, e is an integer greater than or equal to 1, and wherein f, g, h, i, j, o, p, and q are integers greater than or equal to 0, and (f+g+h+i+j+o+p+q) ≥e.

12. The patterning material according to claim 1, wherein in the at least one organic group, an atom directly connected to the Si atom is a halogen atom, an O atom, a carbon (C) atom, a nitrogen (N) atom, a phosphorus (P) atom, a sulfur(S) atom, or a Si atom.

13. The patterning material according to claim 1, further comprising a solvent.

14. The patterning material according to claim 13, wherein excluding the solvent, a mass of the polysiloxane in the patterning material accounts for greater than 50% of a total mass of the patterning material.

15. The patterning material according to claim 1, further comprising another component, wherein the another component comprises one or more of a stabilizer, a dispersant, a photoacid, or a quencher.

16. The patterning material according to claim 1, wherein the patterning material is sensitive to X-rays having wavelengths in a range of 1 nm to 15 nm, and exposure energy required to act on the patterning material during patterning is less than 100 $mJ/cm^2$.

17. A patterned film, wherein the patterned film is formed using a patterning material, wherein the patterning material comprises polysiloxane, wherein the polysiloxane comprises at least one cyclic structure formed by silicon-oxygen (Si—O) bond repetitions and at least one organic group connected to a silicon (Si) atom in the at least one cyclic structure, and wherein at least one of the following is satisfied:

a subset of Si atoms in the at least one cyclic structure are substituted by a metal element; and the at least one organic group comprises a halogen element, and wherein the patterning material is patterned to form the patterned film by exposing the patterning material to an X-ray light through a photomask.

18. The patterned film according to claim 17, wherein resolution of a pattern on the patterned film is in a range of 0.2 nm to 100 nm, and edge roughness of the pattern on the patterned film is in a range of 2% to 30% of the resolution.

19. A method of forming a patterned film formed on a substrate, the method comprising:

forming a coating layer over a silicon wafer;

applying a patterning material onto the coating layer by a spin coating process to form a patterning material film layer having a thickness;

baking the patterning material film layer;

exposing the patterning material film layer to an X-ray light with a wavelength of 1 nm to 15 nm through a photomask at an exposure energy of less than 100 $mJ/cm^2$;

baking the patterning material film layer after the exposing; and developing the patterning material film layer using a developer to form the patterned film, wherein the patterning material comprising polysiloxane, wherein the polysiloxane comprises at least one cyclic structure formed by silicon-oxygen (Si—O) bond repetitions and at least one organic group connected to a silicon (Si) atom in the at least one cyclic structure, and wherein a subset of Si atoms in the at least one cyclic structure are substituted by a metal element.

20. The method according to claim 19, wherein the at least one organic group comprises a halogen element and the patterning material film layer has a thickness of 0.2 nm to 40 nm; and wherein exposing the patterning material film layer to the X-ray light with the wavelength of 1 nm to 15 nm through the photomask is done at an exposure energy of less than 100 $mJ/cm^2$.

* * * * *